United States Patent
Hamilton et al.

(10) Patent No.: US 6,288,371 B1
(45) Date of Patent: Sep. 11, 2001

(54) TEMPERATURE CONTROLLED HIGH POWER BURN-IN BOARD HEAT SINKS

(75) Inventors: Harold E. Hamilton, Minneapolis; Tom A. Tremmel, New Brighton, both of MN (US)

(73) Assignee: Micro Control Company, Minneapolis, MN (US)

( * ) Notice: Subject to any disclaimer, the term of this patent is extended or adjusted under 35 U.S.C. 154(b) by 0 days.

(21) Appl. No.: 09/351,656

(22) Filed: Jul. 13, 1999

(51) Int. Cl.[7] .................................................. G01R 35/00
(52) U.S. Cl. ..................... 219/530; 219/209; 324/760; 324/765; 165/185; 165/80.2
(58) Field of Search .................... 219/497, 209, 219/530, 540; 324/760, 765, 158.1; 165/185, 80.2

(56) References Cited

U.S. PATENT DOCUMENTS

| | | | |
|---|---|---|---|
| 4,791,364 | * 12/1988 | Kufis et al. | 324/760 |
| 4,900,948 | 2/1990 | Hamilton | 307/149 |
| 4,969,511 | * 11/1990 | Person | 165/80.4 |
| 4,982,153 | * 1/1991 | Collins et al. | 324/760 |
| 5,001,423 | * 3/1991 | Abrami et al. | 324/760 |
| 5,086,269 | * 2/1992 | Nobi | 324/760 |
| 5,164,661 | 11/1992 | Jones . | |
| 5,198,752 | * 3/1993 | Miyata et al. | 324/760 |
| 5,198,753 | * 3/1993 | Hamburgen | 324/754 |
| 5,414,370 | 5/1995 | Hashinaga et al. | 324/760 |
| 5,582,235 | 12/1996 | Hamilton et al. | 165/263 |
| 5,911,897 | * 6/1999 | Hamilton | 219/497 |
| 5,977,785 | * 11/1999 | Burward-Hoy | 324/760 |

FOREIGN PATENT DOCUMENTS 6-101947 * 4/1994 (JP) .

OTHER PUBLICATIONS

"Thermal Control Hardware for Accelerated Run–In Testing of Multi–Chip Modules", IBM Tech. Disclosure Bulletin, vol. 32, No. 5A, pp. 129–130, Oct. 1989.*

* cited by examiner

Primary Examiner—John A. Jeffery
(74) Attorney, Agent, or Firm—Westman, Champlin & Kelly, P.A.

(57) ABSTRACT

A heat sink is used for thermally controlling a chip on a burn-in board which is being tested in a burn-in oven. The heat sink includes a resiliently mounted block that will engage a chip under resilient pressure and which is housed in a separate cup that permits accommodating misalignments or shifting of the heat sink when it contacts the chip. Additionally, the block carries a temperature sensor that is resiliently loaded against a chip which the heat sink engages. A bore mounts the temperature sensor and is also connected to a source of helium to provide a layer of helium between a surface of the heat sink and the adjacent surface of the chip for modifying the thermal coupling between the heat sink and the chip.

9 Claims, 7 Drawing Sheets

TEMPERATURE CONTROLLED HIGH POWER BURN-IN BOARD HEAT SINKS

BACKGROUND OF THE INVENTION

The present invention relates to construction and mounting of temperature controlled heat sinks or heat exchanger for burn-in boards where high power is being generated by the circuits on the chips that are being tested on the burn-in board. The heat sinks are made and mounted to have intimate contact with the chips without causing undue loading, and are controlled for cooling, as well as heating, when needed. A helium layer can be provided between the heat sinks and chips when greater heat conductivity is desired between the heat sink and the chip.

In the prior art, burn-in boards for testing integrated circuits in particular have been advanced, and these are usually boards that will mount a number of individual chips, and which are controlled to individually test the circuits on the chips. The tests are carried out in an oven, under an elevated temperature.

It is desirable to control the temperature of the chips to determine that the circuits on the chips are functioning properly. The sequence of testing can be carried out in a known manner. The connections for the burn-in tests are made at the back edge of the burning boards to connectors on the back wall of the oven for the burn-in system. The burn-in board controls are known, and for example, can include controls and connectors such as those shown in U.S. Pat. No. 4,900,948.

SUMMARY OF THE INVENTION

The present invention relates to a temperature controlled heat exchanger or heat sink for a semiconductor chip mounted on a burn-in board. The heat sink is used with very high power consumption circuits which dissipate substantial heat when operated. The heat sinks of the present invention provide adequate cooling to the circuits so that the temperature range of the circuits is maintained within set parameters as sensed by a temperature sensor mounted on the heat sink and controlling the chip.

The burn-in board mounts several individual chips with the surface of the chips facing out from the board, and a separate thermal plate or board is mounted in the oven above each burn-in board. Individual temperature controlled heat sinks are provided for each of the chips on the burn-in board. Individual temperature sensors mounted on the heat sinks for sensing the chip temperature. The heat sinks and temperature sensors are moved into contact with the burn-in boards. The heat sinks, which comprise metal blocks, have passageways through which water can be circulated, as controlled by valves, which are opened and closed in response to the temperature sensor signal indicating temperature shifts of the circuits being tested.

The heat sinks also include a heater assembly, that is shown as a Mica heater, that is a thin layer clamped in place on the heat sink, and controlled to turn on when needed for maintaining a desired temperature on the chip, as sensed by the temperature sensor of each individual heat sink.

The temperature sensor is mounted in a bore in the respective heat sink and extend out to contact the chip surface. The bore is also connected to a source of helium, under low pressure, and when greater thermal conductivity is desired between the chip being tested and the heat sink, a flow of helium is provided through the bore in which temperature sensor is mounted, and the helium will pass out around the sensor and form a thin fluid layer between the heat sink and the circuit surface. This thin layer of helium gives greater thermal conductivity than air, and enhances heat transfer, particularly if there are slight irregularities, which may not even be seen by the naked eye, on the surface of the heat sink and the surface of the chip being tested. By controlling the coolant flow in response to the temperature sensor signals, the heat that is generated by high powered circuits is dissipated adequately and the desired temperature is maintained.

Additionally, the heat sink block is spring mounted in a cup-shaped support, which permits the heat sink to shift slightly, and ensures intimate heat transfer contact between the block and the chip. The heat transfer or thermal conductivity is enhanced by the flow of a thin layer of helium between the mating surfaces. The flow of gas will fill surface irregularities and gaps.

DETAILED DESCRIPTION OF THE ILLUSTRATIVE EMBODIMENTS

Figure 1:
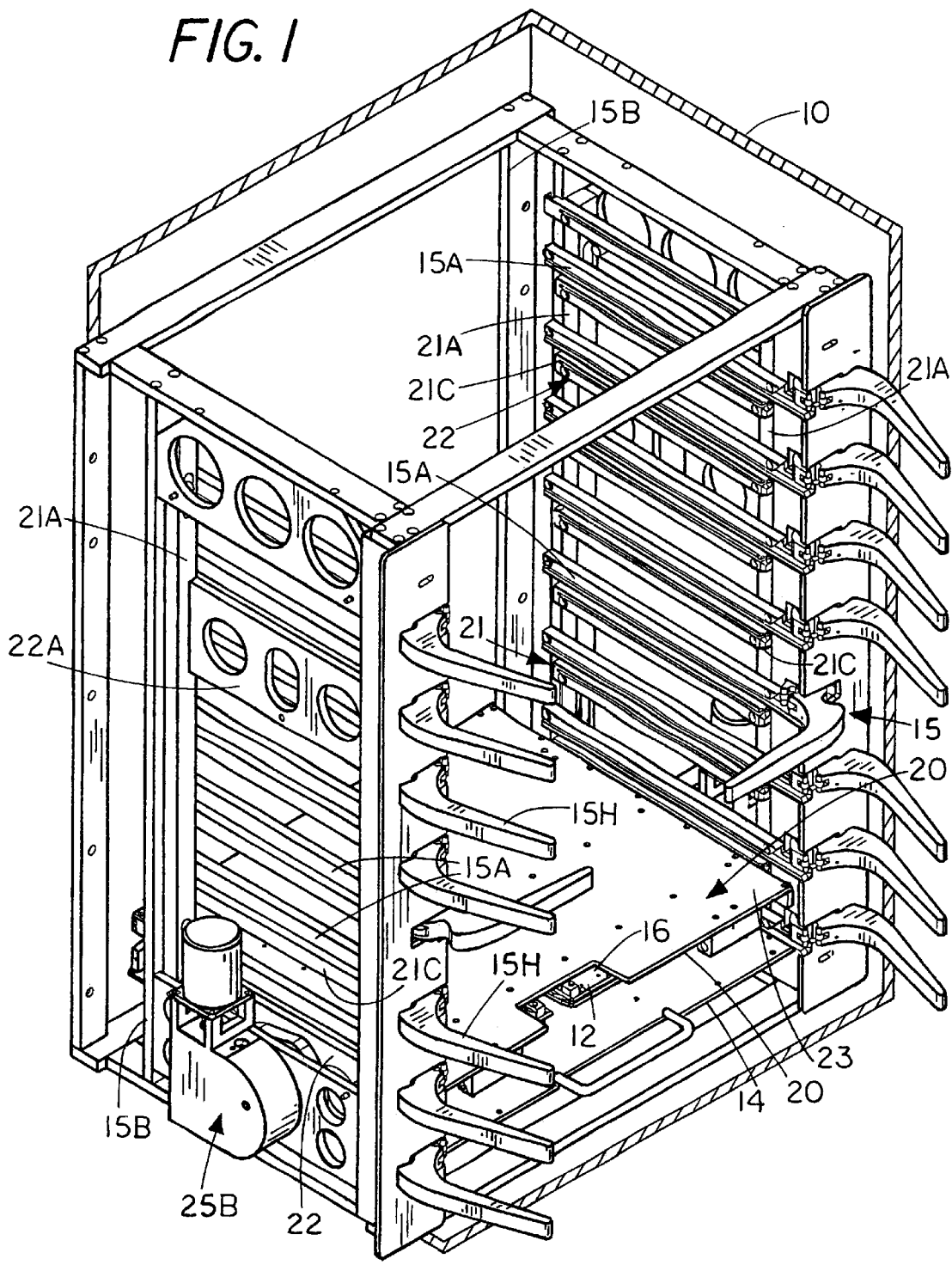
FIG. 1 is a schematic perspective view of a rack used in a burn-in oven and supporting heat exchanger or sinks made according to the present invention above burn-in boards.

An oven that is shown only fragmentarily at 10 is used for burning in integrated circuit chips 12 on burn-in boards 14. A rack 15 supports the boards 14 in the oven on tracks 15A. The burn-in boards generally, in the form shown, mount eight chips having circuits, and each of these chips 12 is mounted along the plane of the burn-in board 14. The circuits on the chips 12 are connected with suitable connectors to external control circuitry 12A for operating the circuits and carrying out tests under heat. The testing is done conventionally. The chips 12 have upper plane surfaces 16 that are to be contacted with a heat exchanger or heat sink for removing excess heat generated by the power consumption of the circuits. The circuits and the chips 12 on which they are formed are to be maintained within a standard temperature range for the test.

A thermal board assembly shown at 20 is mounted on movable frames 21 on each side of the rack 15 that slide vertically, and include uprights 21A that are slidably mounted relative to fixed frame uprights 15B on which burn-in board tracks 15A are supported. As shown, the rack 15 includes light burn-in boards and eight thermal boards. The slidable frames 21 are provided on each side of the rack 15. Thermal board support tracks 21C are mounted on the vertically movable uprights 21A and have grooves 21D to receive flanges 20E on the thermal boards (see FIG. 2). The frames 21 are vertically slidable to move thermal board assemblies 20 toward and away from the chips 12 on the underlying burn-in board 14. The side flanges 20A on the thermal boards 20 slide into the grooves 21D on the tracks 21C. The thermal board assemblies are supported parallel to the respective burn-in board 14. The movement of the thermal board assemblies 20 can be accomplished in any desired manner, so the structure for supporting and moving it is shown only schematically.

Figure 2:
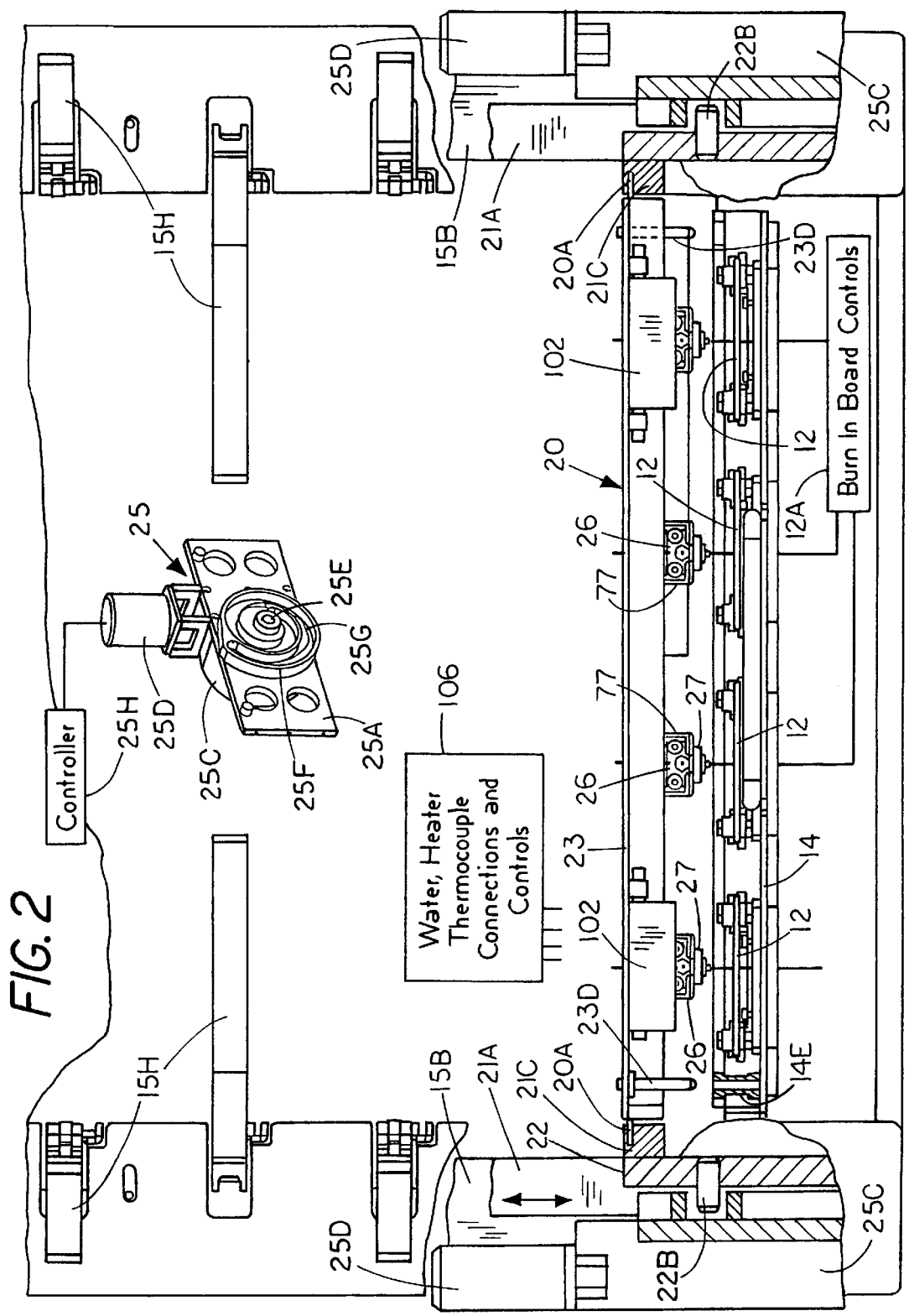
FIG. 2 is a fragmentary schematic front view of a rack supporting a thermal board having heat sinks made according to the present invention installed thereon, shown overlying a burn-in board supporting semi-conductor chips that are associated with the heat sinks with an inset perspective view of a cam drive used for moving thermal boards into contact with an associated burn-in board.

The movable frames 21, in addition to the tracks 15A, that are bolted to and hold the vertical uprights 21A together and lower and upper cross plates 22 and 22A also join the uprights 21A (see FIGS. 1 and 2). The lower cross plate 22 on each movable frame 21 has a cam follower pin 22B mounted thereon and protruding out to the side. The cam follower pin serves as a drive for vertically reciprocating the frame 21. A cam and drive assembly 25B is mounted onto a fixed cross plate 25A mounted to the uprights 15B of the rack supporting the burn-in boards and thermal boards. The cam and drive assembly 25B includes a gear box 25C that is driven from a motor 25D (see also FIG. 2) and the motor 25D has an output shaft 25E that extends through the fixed plate 25A and has a spiral cam member 25F mounted on the shaft. The spiral cam member will rotate when the motor is running, and has a spiral groove 25G that receives the cam follower pin 22B so that when the cam motor 25D is driven and the gear box 25C drives the spiral cam 25C, the pin 22B, which is in the groove 25G, will be moved relative to the central axis of the shaft 25E in a known manner, and will this will reciprocate the frames 21 so that the movement of the thermal board assemblies 20 is accomplished to move the thermal boards toward or away from the burn-in boards, as shown in FIG. 2. There are guide pins 23D on the thermal board assembles that mate with guide tubes 14E on the burn-in boards for alignment. Also, extractor handles 15H are shown. These are used for extracting the burn-in boards.

The driving of the motors 25D, which are stepper motors, and are synchronized, is done with a controller 25H shown schematically in FIG. 2.

Figure 7:
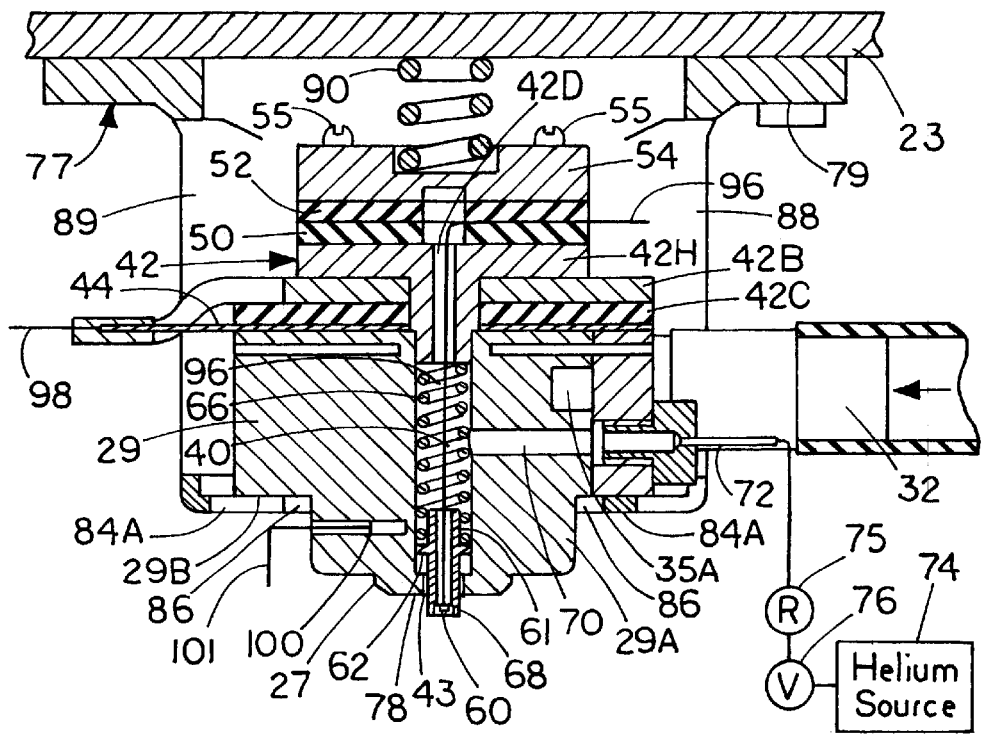
FIG. 7 is a sectional view taken on Line 7—7 in FIG. 6.
Figure 10:
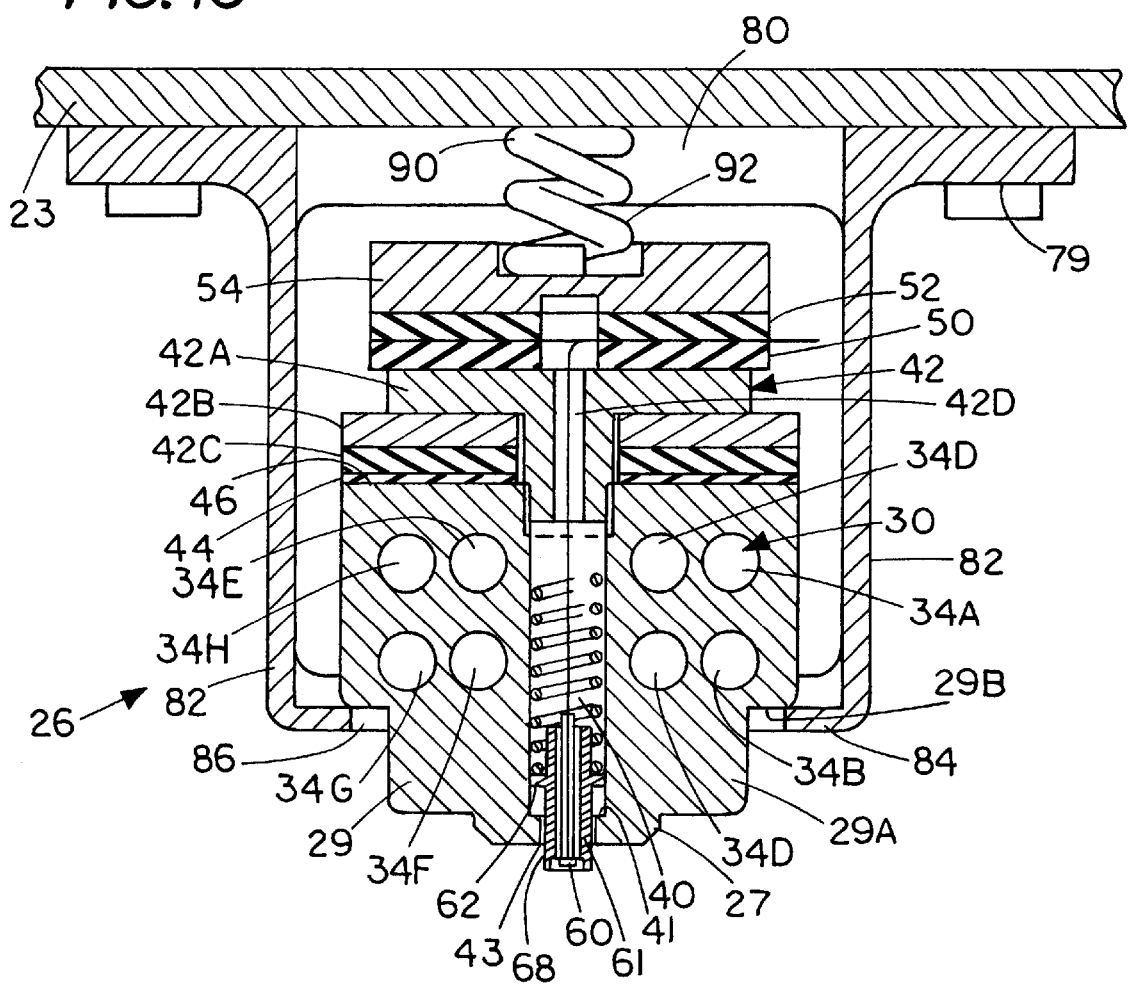
FIG. 10 is a sectional view taken as on line 10—10 in FIG. 5.

The thermal board assemblies 20 include metal heat conductive plates 23, each of which has a mounts a plurality of heat exchangers or heat sinks 26, which are equal in number to the number of chips on the aligned burn-in board. Each heat sink 26 includes a central block 29 that has an end boss that will contact a surface of one of the chips 21 that is being tested on the burn-in board 14. FIG. 10 and other cross sections show the central block 29. As shown, the block 29 has a plurality of longitudinal passageways 30 bored therethrough, with end cross passages that connect the passageways so that water from a water input connector and line 32 will enter a first passageway 34A, and the water then will be circulated through additional passageways 34B, 34C, 34D, 34E, 34F, 34G and 34H in sequence, so that the waste water or water that has been used for cooling, comes through the last passageway 34H discharged through a connector and line 36 and sent to drain. The end caps are made in a conventional manner and are soldered or otherwise sealed on the ends of the center block. FIG. 7 shows a connecting passageway 35A that connects passageways 34D and 34E and FIG. 10 shows a passageway 35B connects passageways 34F and a passageway 35C that connects passageway 34G and 34H. The connector passageways are made in the ends of the blocks. The end caps are soldered in place so the central block becomes unitary and is cross sectioned as one body in FIGS. 7, 8 and 10.

The block 29 has a central passageway 40 that is bored into the block 29 into the boss 27. A shoulder 31 surrounds an opening 43 in boss 27. The passageway 40 has an axis that is at right angles to the plane of the block and plate 23 and at right angles to the axes of passageways 30. The through passageway 40 extends upwardly, and a cap 42 has a threaded neck that threads into the end of passageway 40 and seals it. The cap 42 also has a flange 42A that bears upon a cover plate 42B that covers a layer of insulation 42C that, in turn, overlies a heater 44 sandwiched between the insulation layer 42B and an upper surface 46 of the central block 29. The neck of cap 42 has a passageway 42D that aligns with passageway 40 and is of smaller diameter. The threads on the neck of the cap seal the passageway 40 along its edge and the heater 44 and insulation layer 42C form a gas tight seal.

There are two stacked gaskets 50 and 52 on top of the flanges 42A. A clamp plate 54 is used for holding the cover plate in position on top of the cap 42. The gaskets 50 and 52 have central holes aligning with passageway 42D and clamp plate 54 closes off the holes the passageway 42D. The clamp plate 54 is held with screws 55 threaded into flange 42A.

A thermocouple 60 is mounted in the end of the bore or passageway 40. The thermocouple 60 is mounted in a cylindrical, tube carrier 61 that has an annular flange 62 around the carrier that slides in the bore 40, as shown. The bore 40 has shoulder 41 at the lower end for retaining the flange 62 in the bore 40. The tube 61 carrying the thermocouple has an end portion 68 that extends out opening 43. The flange 62 slides in the larger part of the bore 40. There is a small space or clearance between the periphery of the bore 40 and the flange 62 and also between end cylindrical portion 68 and the surface defining opening 43.

A low force coil spring 66 is mounted in bore 40 and bears against the flange 62 and is held in the bore by cap 42. The spring 66 wages the tube carrier 61 and thus thermocouple 60 outwardly so flanges 62 contacts shoulder 41. The cross sectional view shows the carrier 61 retracted slightly.

Referring to FIG. 7, it can be seen that the bore 40 is intercepted with a cross bore 70 that is connected to a hose barb 72 that in turn is connected to a source of helium 74 through a regulator 75 and valve 76 that can be manually operated, or operated in some other desired manner. Normally a solenoid operated valve controlled by the person running the burn-in tests would be used.

Helium can be provided at a regulated pressure, usually between zero and 5 psi, into the bore 70, and when provided, the gas will flow out around the space between the flange 62 and the bore 40 and between the cylindrical end section 68 and the opening 43 will flow around the end surface 78 of the boss 27 of the heat sink and along the surface 12A of the chip 12 which is being tested. It can be seen that the low force spring 66 will hold the thermocouple in engagement with the chip surface under spring load, but the spring 66 will yield to permit the chip and the thermocouple 60 at the end of the end of tube section 68 to be in intimate contact when surface 78 contacts the surface of a chip.

The heat exchanger or heat sinks 26 are mounted in an outer cage or housing called a "cup" 77 that has a flange 79 around the periphery thereof that bolts or fastens in a suitable manner with fasteners to the metal thermal plate 23.

Figure 8:
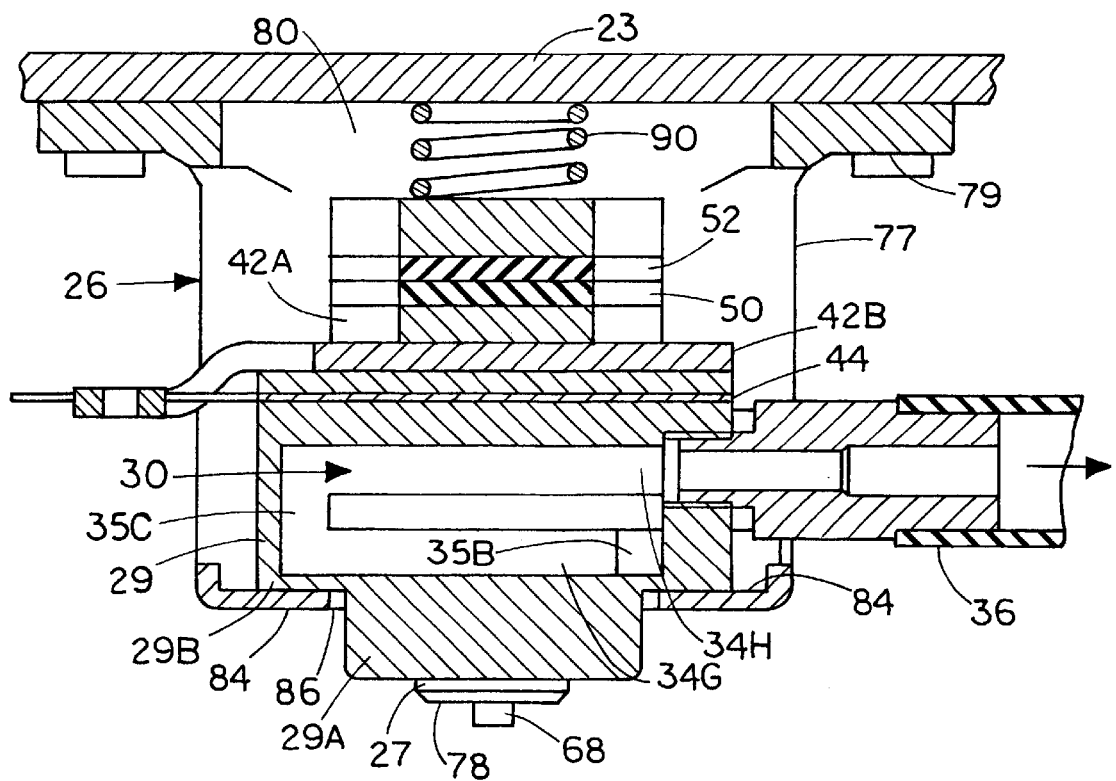
FIG. 8 is a sectional view taken on Line 8—8 in FIG. 6.
Figure 9:
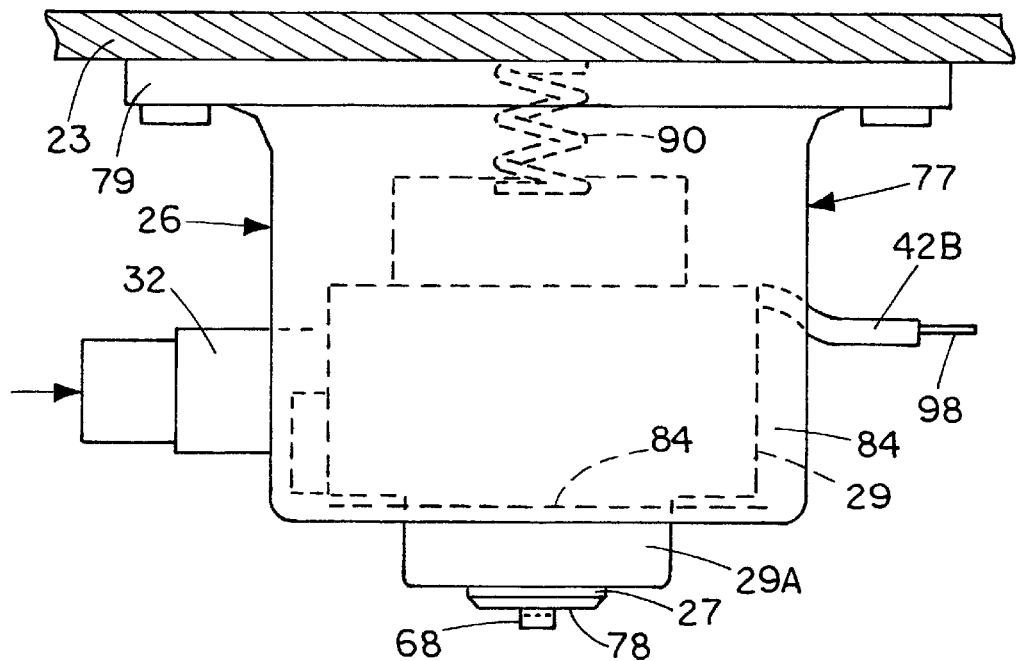
FIG. 9 is a side view of the heat sink and cup from a side opposite from that shown in FIG. 4.

The cup 77 has an opening 80 at the top depending side walls 82 on two spaced sides with inwardly turning flanges 84 at the lower ends. The sides of the cup at right angles to walls 82 form openings 88 and 90, but there are internal flanges 84A, which, together with edges 84, surround a central opening 86 through which the end portion 29A of the thermal block extends with some clearance. The heat sink block 29 has a larger upper portion that forms a shoulder 29B that rests on the flange 84 when the portion 29A extends through the opening 86, as shown in FIGS. 7, 8 and 10. The openings 88 and 90 at right angles to the main depending walls 82, to permit connections for water, helium, and for the electrical connections to extend to the heat sink block. The portion 29A is encircled by the flanges 84 and 84A and the shoulder 29B is contained and rests on this intern flange or wall 84 and 84A.

A compression coil spring 90 is mounted in a cavity 92 formed in the clamp plate 54. The spring 90 bears against the underside of the thermal plate 23, as shown in the cross-sectional views to provide a spring load urging the shoulder 29B down against the flanges or bottom edge walls 84 and 84A.

It should also be noted that the heat sink block 29 is spaced from the side walls 82, and the partial side walls forming the end openings 88 and 90, so that the block 29 can move up to space the shoulders 29B from the wall flanges 84 and 84A under pressures applied when the thermal plate assembly 20 is moved down against an aligned burn-in board. The block 29 can cock slightly because the opening 86 is made slightly larger than the end portion 29A that extends through it. This permits the block 29 to generally align with the surface of the chip that it is moved against, so that the surface 78 of the boss 27 of the heat sink will come into as close to continuous contact as possible. The thermocouple 60 will retract as well, as permitted by the spring 66.

The spring 90 will also retract and yield so that the heat sink can move upwardly and self-aligning because the cup 77 will positively capture the heat sink and yet permit it to retract and move for self-alignment.

Thus, the thermocouple 60 is spring loaded with a light spring, and the entire heat sink block is spring loaded with a second spring 90 of different strength. The structure permits the thermocouple connection wires indicated at 96 to pass upwardly through the bore 40, and through the bore 42D, and through the center opening in the gasket 50, and then laterally out sandwiches between the gaskets 50 and 52, as shown in FIGS. 7 and 10. This eliminates the need for providing a groove or opening for the thermocouple wires and yet keeps the passageway 40 sealed so that the helium gas will be forced out through the opening 43.

The heater 44 also has wires or leads 98 that pass out along the top plate 42B, and are supported thereby.

The temperature of the heat sink block 29 also is sensed and controlled with a suitable thermocouple 100 that is installed in a bore in the block portion 29A, that is adjacent to the boss 27 which contact the chip. Suitable leads 101 can be used for this thermocouple.

Figure 3:
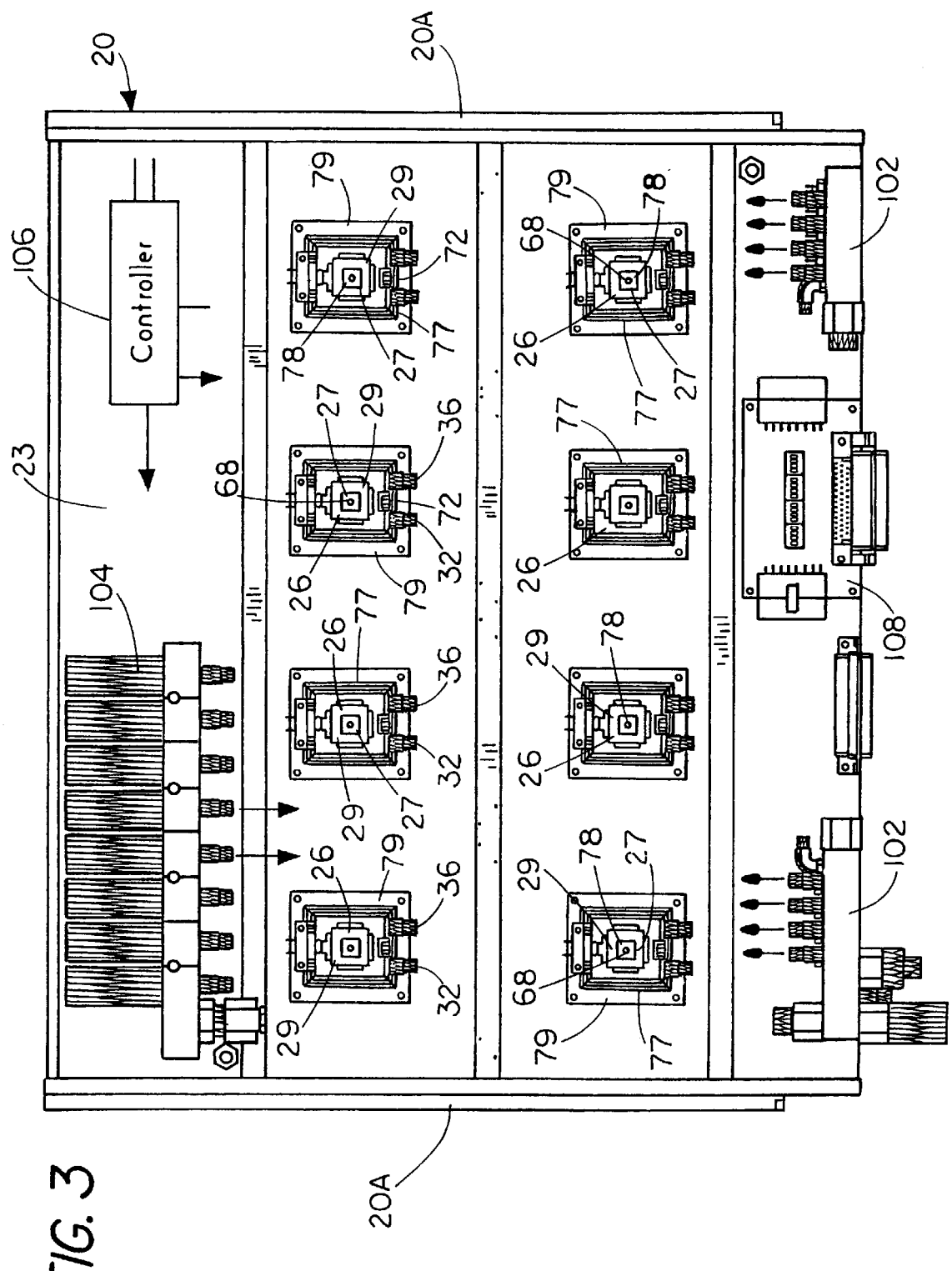
FIG. 3 is a bottom plan view of a typical thermal board having heat sinks and mounting made according to the present invention.
Figure 4:
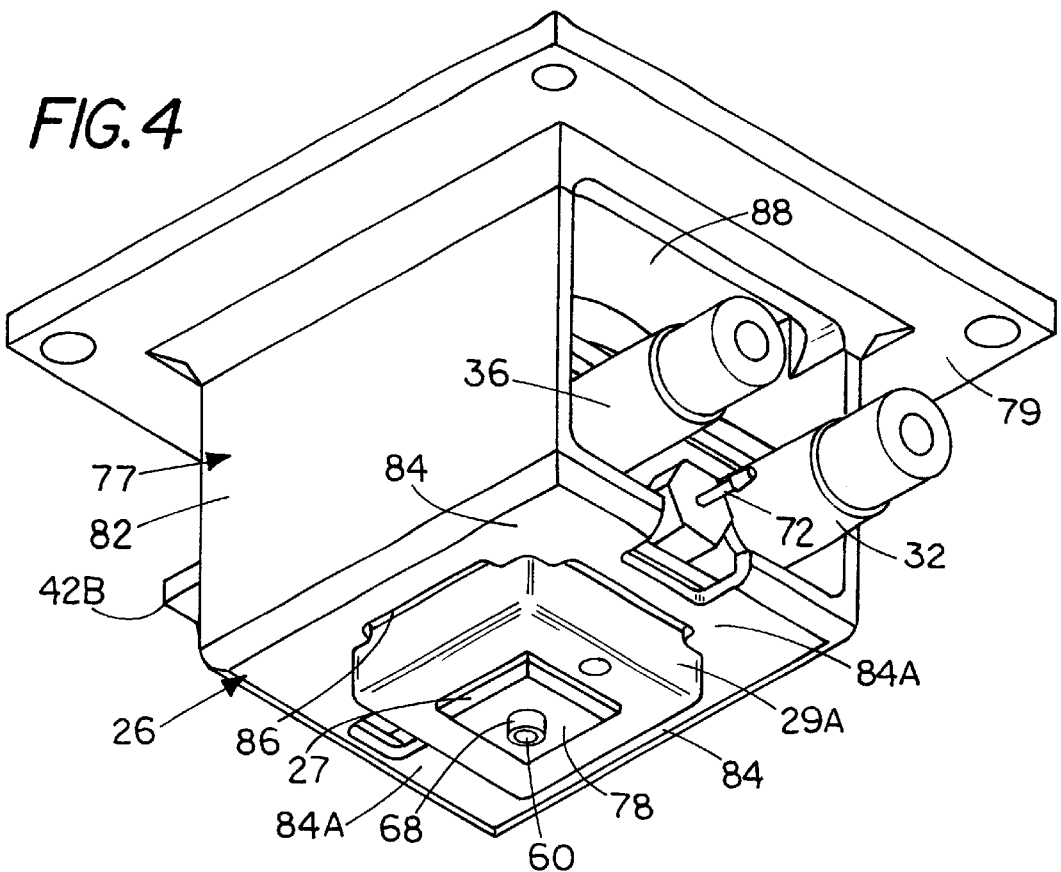
FIG. 4 is a bottom perspective view of a heat sink and support cup shown in FIG. 3.
Figure 5:
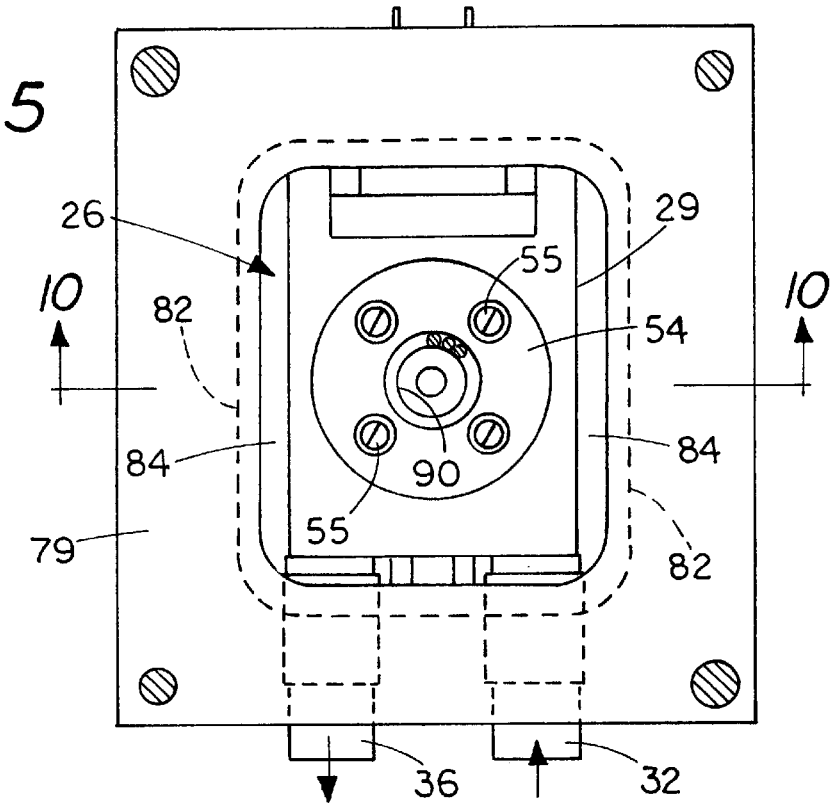
FIG. 5 is a top plan view of the heat sink and cup of FIG. 4.
Figure 6:
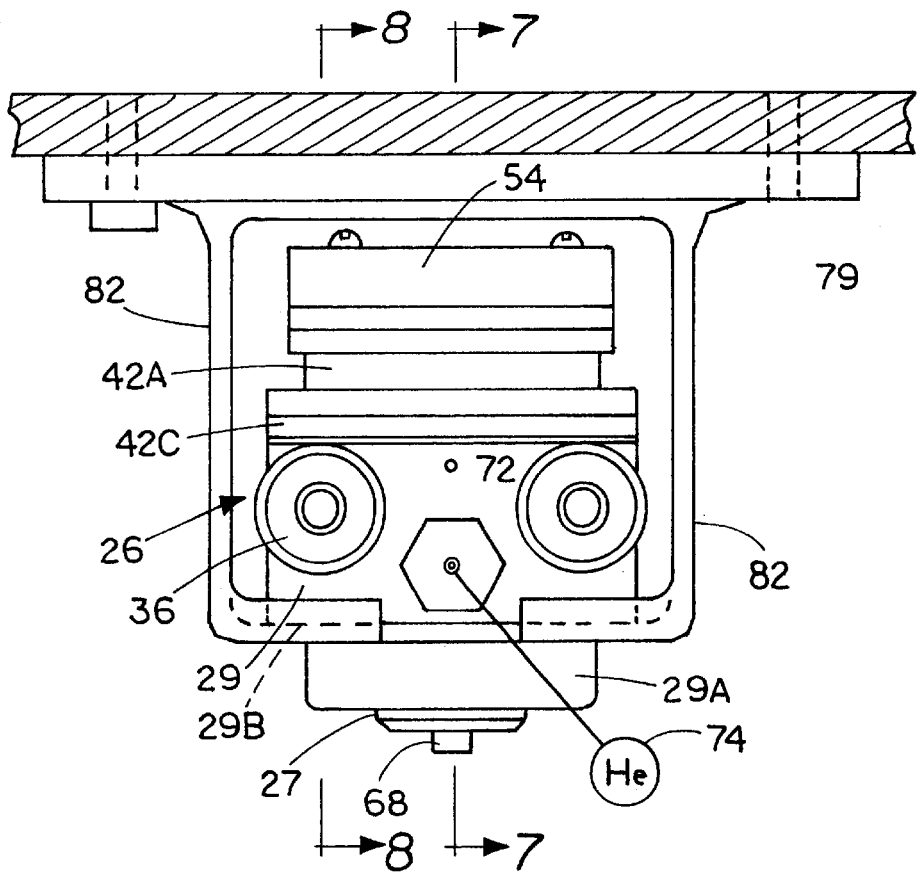
FIG. 6 is an end view of the heat sink and cup of FIG. 5.

In FIG. 3, manifolds indicated at 102 are provided for the helium connections, and are shown schematically, and solenoid valves shown schematically at 104 can be used for providing water to each of the individual heat sinks. A controller 106 receives the signals from thermocouple 60 and will provide signals to the individual solenoid valves 104 in a suitable manner to open them if cooling is needed and close them if the chip temperature is in the desired range. Controller 106 also can receive a signal from the thermocouple 100 for overall temperature control and will provide output signals to the leads 98 for the heater, when that is needed. Control of thermocouples can be through suitable connectors and circuitry shown schematically on a circuit board 108 in FIG. 3. Other suitable connectors can be used for carrying the power to the solenoids 104, and the overall arrangement can be made so that the controller 106 is not on the thermal board, but is kept separate. It is shown only schematically in FIG. 3. By regulating the flow of water using individual solenoid valves for each of the heat sinks that are used with a burn-in board assembly (8 in the situation shown) the temperature of the chip can be maintained closely, and again, the use of a flow of helium forming a layer of gas provides good thermal coupling between the heat sink blocks and the associated chip on the burn-in board to accommodate irregularities in the surfaces that mate. The use of helium also gives the ability to control the temperature closely.

The heater 44 can be used where the chip being tested has circuits that do not consume much power, and the temperature has to be maintained at a particular level requiring the addition of heat. Of course, during that time, the water cooling would not be used, but heat would be added through the thermal block, and the heat conducting layer of helium can also be provided at that time for conducting heat to a chip.

Although the present invention has been described with reference to preferred embodiments, workers skilled in the art will recognize that changes may be made in form and detail without departing from the spirit and scope of the invention.

What is claimed is:

1. For use with an integrated circuit chip mounted in a burn-in oven, a heat exchanger having a surface for making contact with a chip, a bore in the heat exchanger opening to the surface, a temperature sensor mounted in the bore of the heat exchanger and positioned to engage a surface of a chip, a spring for urging the temperature sensor outwardly from the surface of the heat exchanger to engage the surface of the chip, and a duct leading from a source of helium to the bore, the helium flowing out of the bore from spaces between the bore and the temperature sensor, to the surface of the heat exchanger to provide a thermally conductive helium layer along the surface of the heat exchanger.

2. The heat exchanger of claim 1 and a cup member for supporting the heat exchanger, said cup member having a wall portion encircling the heat exchanger and providing an opening through which a boss on the heat exchanger extends.

3. The heat exchanger of claim 2 and a spring for urging the heat exchanger against the wall portion surrounding the boss on the heat sink and providing a resilient force when the boss engages a chip.

4. A heat sink assembly for a burn-in board circuitry comprising a heat sink block, said heat sink block having a surface engageable with a chip to be thermally controlled, a plurality of passageways in said heat sink block for receiving water to flow through the heat sink block, a temperature sensor mounted on said heat sink for sensing the temperature of a chip with which the heat sink block is associated, a controller for receiving the signal from the temperature sensor and regulating the flow of water through the passageways of the heat sink block, a cup member for supporting the heat sink block relative to a chip with which it is used, said cup member having an encircling wall defining an opening through which a portion of the heat sink block extends, and a resilient member for urging the heat sink block toward the encircling wall and providing a resilient loading that permits the heat sink block to move relative to the cup when the heat sink block engages a surface of a chip.

5. The heat sink of claim 4 wherein said heat sink block has a bore opening to a surface engagable with a chip to be thermally controlled, and a source of helium connected to said bore for providing a layer of helium between the surface of the heat sink block engageable with a chip and chip with which the heat sink is used.

6. The heat sink of claim 4 wherein the temperature sensor is mounted in a bore in the heat sink block that opens to the surface engageable with a chip, and a spring in the bore urging the temperature sensor outwardly to a stopped position.

7. The heat sink of claim 6 wherein the bore is surrounded by two gaskets stacked one on top of the other and sealingly clamped in position, leads for the temperature sensor being sandwiched between the gaskets and extending laterally to an exterior of the heat sink block.

8. The heat sink of claim 4 and a heater in contact with the heat sink and controllable to add heat to the heat sink.

9. For use with an integrated circuit chip mounted in a burn-in oven, a support, a heat exchanger mounted on the support and having a surface for contacting a chip, the heat exchanger being movable on the support so the surface is movable toward and away from a chip positioned to contact the surface a limited amount, a spring between the support and the heat exchanger urging the heat exchanger toward the chip positioned to contact the surface, a bore in the heat exchanger opening to the surface, said bore overlying the chip in a central location of the chip, a duct leading from the bore to a source of helium, whereby helium flowing out of the bore flows along the chip for providing a thermally conductive layer along the surface of the heat exchanger.

* * * * *